United States Patent
Katzir

(10) Patent No.: US 11,012,643 B2
(45) Date of Patent: May 18, 2021

(54) SYSTEM AND METHOD FOR SPECTRAL IMAGING

(71) Applicant: Applied Spectral Imaging Ltd., Yokneam (IL)

(72) Inventor: Nir Katzir, Givat Elah (IL)

(73) Assignee: Applied Spectral Imaging Ltd., Yokneam (IL)

( * ) Notice: Subject to any disclaimer, the term of this patent is extended or adjusted under 35 U.S.C. 154(b) by 71 days.

(21) Appl. No.: 15/379,519

(22) Filed: Dec. 15, 2016

(65) Prior Publication Data

US 2017/0171476 A1    Jun. 15, 2017

Related U.S. Application Data

(60) Provisional application No. 62/267,360, filed on Dec. 15, 2015.

(51) Int. Cl.
*H04N 5/33*     (2006.01)
*G01J 3/453*    (2006.01)
(Continued)

(52) U.S. Cl.
CPC .............. *H04N 5/332* (2013.01); *G01B 9/02* (2013.01); *G01J 3/0229* (2013.01); *G01J 3/26* (2013.01); *G01J 3/2823* (2013.01); *G01J 3/45* (2013.01); *G01J 3/453* (2013.01); *G01J 3/513* (2013.01); *G02B 26/001* (2013.01); *G06T 5/002* (2013.01); *H01L 27/14621* (2013.01);
(Continued)

(58) Field of Classification Search
CPC .......... H04N 5/332; H04N 9/045; G01J 3/45; G01J 3/0229; G01J 3/453; G01J 3/513; G01J 3/2823; G01J 3/26; G01J 2003/2826; H01L 27/14621; G06T 5/002; G01B 9/02; G02B 26/001

See application file for complete search history.

(56) References Cited

U.S. PATENT DOCUMENTS 5,991,028 A * 11/1999 Cabib .................. C12Q 1/6816
                                                                              356/456
7,706,606 B1 * 4/2010 Ruzon ................ H04N 1/40012
                                                                              382/162

(Continued)

FOREIGN PATENT DOCUMENTS

JP        2007-033217      2/2007
WO    WO-2015185662 A2 * 12/2015 ............. G01N 21/80

OTHER PUBLICATIONS

European Search Report and the European Search Opinion dated Oct. 12, 2017 From the European Patent Office Re. Application No. 16204270.9. (19 Pages).

(Continued)

*Primary Examiner* — Richard A Hansell, Jr.

(57) ABSTRACT

A spectral imaging system comprises: a sequential optical system providing a temporal sequence of output light beams describing the scene; a color imager receiving the output light beams and responsively generating, for each output light beam, an image signal that is spatially resolved into a plurality of color channels. The system can also comprise an image processor that collectively process the image signals to construct a spectral image of the scene.

38 Claims, 9 Drawing Sheets
(1 of 9 Drawing Sheet(s) Filed in Color)

(51) Int. Cl.
*G01J 3/51* (2006.01)
*G01J 3/26* (2006.01)
*G01B 9/02* (2006.01)
*G02B 26/00* (2006.01)
*H04N 9/04* (2006.01)
*G01J 3/02* (2006.01)
*G01J 3/28* (2006.01)
*G01J 3/45* (2006.01)
*G06T 5/00* (2006.01)
*H01L 27/146* (2006.01)

(52) U.S. Cl.
CPC ......... *H04N 9/045* (2013.01); *H04N 9/04557* (2018.08); *G01J 2003/2826* (2013.01)

(56) References Cited

U.S. PATENT DOCUMENTS

| | | | |
|---|---|---|---|
| 8,589,104 B2 | 11/2013 | Winter et al. | |
| 9,386,211 B2* | 7/2016 | Soenksen | G02B 21/008 |
| 9,719,777 B1* | 8/2017 | Colonna de Lega | G01B 9/02083 |
| 2001/0033364 A1* | 10/2001 | Cabib | G01J 3/2823 351/221 |
| 2002/0088928 A1 | 7/2002 | Noda | |
| 2007/0140553 A1* | 6/2007 | Katsumata | G01J 3/501 382/162 |
| 2008/0158396 A1* | 7/2008 | Fainstain | H04N 9/04515 348/246 |
| 2008/0192988 A1* | 8/2008 | Uludag | G06K 9/6293 382/115 |
| 2010/0179770 A1* | 7/2010 | Fuhrman | G01J 3/027 702/28 |
| 2010/0195162 A1* | 8/2010 | Majewicz | H04N 1/40012 358/3.23 |
| 2010/0280781 A1 | 11/2010 | Winter et al. | |
| 2011/0013835 A1 | 1/2011 | Eguchi et al. | |
| 2011/0019032 A1* | 1/2011 | Pinsky | G06T 5/40 348/238 |
| 2012/0114216 A1* | 5/2012 | Maddison | G06K 9/0014 382/133 |
| 2014/0364745 A1* | 12/2014 | Patwardhan | A61B 5/0075 600/476 |
| 2015/0030503 A1 | 1/2015 | Angel et al. | |
| 2015/0071549 A1* | 3/2015 | Chajed | G06K 9/3275 382/199 |
| 2015/0182178 A1 | 7/2015 | Baturin et al. | |
| 2016/0066775 A1* | 3/2016 | Hunter | G01J 3/45 600/178 |
| 2017/0161545 A1* | 6/2017 | Champlin | G06K 9/4652 |
| 2017/0176336 A1* | 6/2017 | Dimitriadis | G01N 21/6456 |

OTHER PUBLICATIONS

Partial European Search Report and the Provisional European Search Opinion dated Jun. 8, 2017 From the European Patent Office Re. Application No. 16204270.9. (15 Pages).

Singh Mehta et al. "Quantitative Phase Imagign of Human Red blood Cells Using Phase-Shifting White Light Interference Microscopy With Colour Fringe Analysis", Applied Physics Letters, XP012168022, 101(20): 203701-1-203701-6, Published Online Nov. 12, 2012.

Zhao et al. "Image-Based Spectral Reflectance Reconstruction Using the Matrix R Method", Color Research & Application, XP002599916, 32(5): 343-351, Oct. 2007. p. 346-350.

* cited by examiner

FIG. 9A    FIG. 9B    FIG. 9C
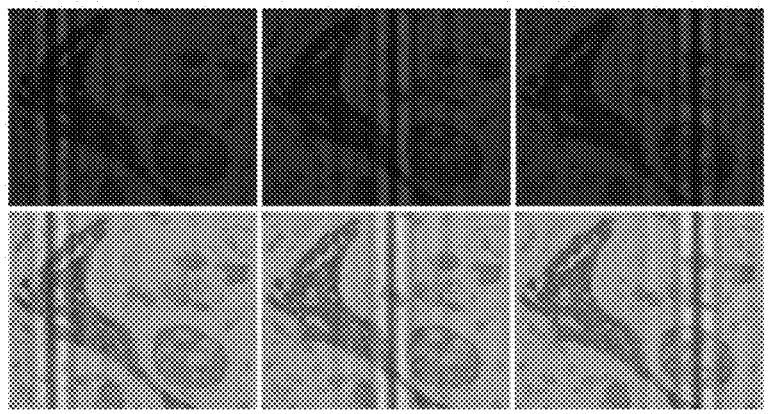
FIG. 9D    FIG. 9E    FIG. 9F
FIG. 10A    FIG. 10B    FIG. 10C
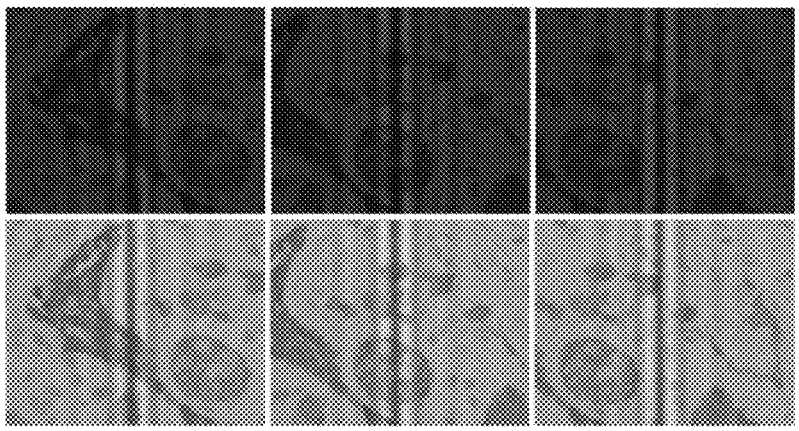
FIG. 10D    FIG. 10E    FIG. 10F
 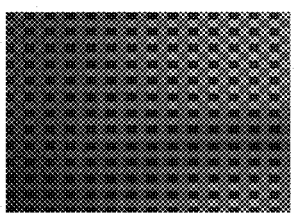 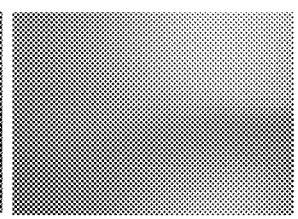
FIG. 11A    FIG. 11B    FIG. 11C

SYSTEM AND METHOD FOR SPECTRAL IMAGING

RELATED APPLICATION

This application claims benefit of priority under 35 USC 119(e) of U.S. Provisional Patent Application No. 62/267,360 filed on Dec. 15, 2015, the contents of which are incorporated herein by reference in their entirety.

FIELD AND BACKGROUND OF THE INVENTION

The present invention, in some embodiments thereof, relates to imaging and, more particularly, but not exclusively, to spectral imaging.

Spectral imaging is a technique in which a spectrum is measured for each pixel of an imager. The resulting dataset is three-dimensional (3D) in which two dimensions are parallel to the imager plane and the third dimension is the wavelength. Such dataset is known as a "spectral image" which can be written as $I(x,y,\lambda)$, where x and y are the position in the imager plane, $\lambda$ the wavelength, and I is the intensity at each point and wavelength.

Several spectral imaging techniques are known [Y. Garini, N. Katzir, D. Cabib, R. A. Buckwald, D. G. Soenksen, and Z. Malik, Spectral Bio-Imaging, in Fluorescence Imaging Spectroscopy and Microscopy, X. F. Wang and B. Herman, Editors. 1996, John Wiley and Sons: New York. p. 87-124; Y. Garini, I. T. Young, and G. McNamara, Spectral imaging: principles and applications. Cytometry, 69A, 735-747 (2006)]. In some systems, a set of filters is mounted on a filter wheel with a mechanism that allows capturing a set of images, each time thorough a different color filter. A tunable filter can alternatively be used to capture a set of images, each corresponding to a different color/wavelength range, modifying voltage or frequency and eliminating mechanical movements. In other systems, a spectral image is formed by means of a Fourier transform, as disclosed, for example, in U.S. Pat. No. 5,539,517, the contents of which are hereby incorporated by reference.

Color imaging is a technique in which each pixel of the imager is represented by 3 color channels. Known color cameras employ a charged coupled device (CCD) or complementary metal-oxide semiconductor (CMOS) sensor as the imager. These types of imagers employ a Bayer filter [U.S. Pat. No. 3,971,065, the contents of which are hereby incorporated by reference]. A Bayer filter is designed to be analogous to the cones of the human visual system, and has red, green, and blue color filter elements superimposed on the pixels of the imager. The Bayer filter array samples the green information on a quincunx grid and the red and the blue information on a rectangular grid, such that the green information is therefore sampled at a higher frequency. This is because the peak sensitivity of the human visual system lies in the medium wavelengths.

Also known are 3-sensor cameras employing three imagers. These include 3CCD cameras employing three CCD imagers and 3CMOS cameras employing three CMOS imagers. In a 3-sensor camera, each imager takes a separate measurement of red, green, and blue light. Light coming into the camera is split by a trichroic prism assembly, which directs the appropriate wavelength ranges of light to their respective imagers.

SUMMARY OF THE INVENTION

According to an aspect of some embodiments of the present invention there is provided a spectral imaging system. The system comprises: a sequential optical system providing a temporal sequence of output light beams describing the scene; a color imager receiving the output light beams and being configured to responsively generate, for each output light beam, an image signal that is spatially resolved into a plurality of color channels; and an image processor configured for collectively processing the image signals to construct a static spectral image of the scene.

According to some embodiments of the invention, the sequential optical system comprises an interferometer system, wherein each output light beam constitutes two interfering light beams characterized by a different optical path difference (OPD) therebetween.

According to some embodiments of the invention the sequential optical system comprises a tunable optical filter, wherein each output light beam is characterized by a different central wavelength of the tunable optical filter.

According to some embodiments of the invention the image processor is configured to apply for each picture-element that correspond to a color channel, an intensity correction factor selected to ensure that a ratio between an intensity corresponding to the color channel and an integrated intensity corresponding to a plurality of color channels in a region of the image containing the picture-element is preserved.

According to some embodiments of the invention the image processor is configured to convert image data constituted by the image signals to greyscale levels.

According to some embodiments of the invention the color imager comprises a single two-dimensional array of elementary light detectors covered by a color filter array.

According to some embodiments of the invention the color filter is a Bayer filter.

According to some embodiments of the invention the conversion of the image data to greyscale levels comprises binning neighboring picture-elements corresponding to different color channels in a non-overlapping manner.

According to some embodiments of the invention the conversion of the image data to greyscale levels comprises, for each picture-element of at least a few picture-elements in the image data, integrating intensities of picture-elements in a region containing the picture-element and assigning to the picture-element a greyscale level based on the integration.

According to some embodiments of the invention the color imager comprises a plurality of two-dimensional arrays of elementary light detectors, wherein the system comprises an optical element constructed for splitting the output light beam to the plurality of color channels and to direct different color channels to different arrays.

According to some embodiments of the invention the color imager comprises a single two-dimensional array of elementary light detectors covered by a color filter array.

According to some embodiments of the invention the color imager comprises a plurality of two-dimensional arrays of elementary light detectors, wherein the system comprises an optical element constructed for splitting the output light beam to the plurality of color channels and to direct different color channels to different arrays.

According to some embodiments of the invention the temporal sequence of output light beams comprises a sequence of at least five different output light beams.

According to some embodiments of the invention the plurality of color channels is three color channels. According to some embodiments of the invention each of the three color channels is in the visible range.

According to some embodiments of the invention the plurality of color channels is four color channels. According to some embodiments of the invention one of the four color channels is in the infrared range and each of the remaining three color channels is in the visible range.

According to some embodiments of the invention the image processor is configured to apply image uniformity correction to spatial information in the spectral image.

According to some embodiments of the invention image processor is configured to correct an intensity level of each of at least some picture-elements of the spectral image using local intensity associated with a respective color channel in the image data.

According to some embodiments of the invention the system comprises optics configured for focusing the input light beam directly onto the imager, wherein the image processor is configured to provide a color image of the scene based on image data generated by the imager responsively to the direct focus.

According to some embodiments of the invention the image processor is configured to reduce fringe pattern amplitudes from image data constituted by an image signal of a single output light beam of the temporal sequence, to provide a color image from the single output light beam.

According to some embodiments of the invention the system comprises locomotion mechanism, for shifting a relative position between the scene and the system, wherein the image processor is configured to extract, for each relative position, a portion of the image data in which fringe pattern amplitudes are reduced relative to other portions of the image data, and to tile the extracted portions.

According to an aspect of some embodiments of the present invention there is provided a method of constructing a spectral image of a scene. The method comprises: receiving an input light beam from the scene; converting the input light beam into a temporal sequence of output light beams; for each output light beam of the sequence, generating an image signal that is spatially resolved into a plurality of color channels; and collectively processing the image signals to construct a spectral image of the scene.

According to some embodiments of the invention the conversion of the input light beam into a temporal sequence of output light beams sequential optical is by a controllable interferometer system.

According to some embodiments of the invention the conversion of the input light beam into a temporal sequence of output light beams sequential optical is by a tunable optical filter.

According to some embodiments of the invention the method comprises, for each picture-element that correspond to a color channel, applying an intensity correction factor selected to ensure that a ratio between an intensity corresponding to the color channel and an integrated intensity corresponding to a plurality of color channels in a region containing the picture-element is preserved.

According to some embodiments of the invention the method comprises converting the image data to greyscale levels.

According to some embodiments of the invention the image data is generated by a color imager having a single two-dimensional array of elementary light detectors covered by a color filter array.

According to some embodiments of the invention the conversion of the image data to greyscale levels comprises binning neighboring picture-elements corresponding to different color channels in a non-overlapping manner.

According to some embodiments of the invention the conversion of the image data to greyscale levels comprises, for each picture-element of at least a few picture-elements in the image data, integrating intensities of picture-elements in a region containing the picture-element and assigning to the picture-element a greyscale level based on the integration.

According to some embodiments of the invention the image data is generated by a color imager having a plurality of two-dimensional arrays of elementary light detectors, wherein the system comprises an optical element constructed for splitting the output light beam to the plurality of color channels and to direct different color channels to different arrays.

According to some embodiments of the invention the conversion of the image data to greyscale levels comprises, for each picture-element of at least a few picture-elements in the image data, integrating over color channels, obtained from respective elementary light detectors of the plurality of two-dimensional arrays and being associated with the picture-element, and assigning to the picture-element a greyscale level based on the integration.

According to some embodiments of the invention the method comprises applying image uniformity correction to spatial information in the spectral image.

According to some embodiments of the invention the method comprises correcting an intensity level of each of at least some picture-elements of the spectral image using local intensity associated with a respective color channel in the image data.

According to an aspect of some embodiments of the present invention there is provided a method of constructing a color image of a scene. The method comprises: receiving by an interferometer system an input light beam from the scene and converting the input light beam into an output light beam constituting two interfering light beams characterized by a fixed optical path difference (OPD) therebetween; generating from the output beam an image signal that is spatially resolved into a plurality of color channels; and reducing fringe pattern amplitudes from the image signal to provide a pixelated color image corresponding to the image signal with reduced fringe pattern amplitudes.

According to some embodiments of the invention the method comprises shifting a relative position between the scene and the interferometer system, extracting, for each relative position, a portion of the image signal in which fringe pattern amplitudes are reduced relative to other portions of the image signal, and tiling the extracted portions.

According to some embodiments of the invention the tiling comprises removing periodic parts of in the extracted portions.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data.

Optionally, a network connection is provided as well. A display and/or a user input device such as a keyboard or mouse are optionally provided as well.

BRIEF DESCRIPTION OF SEVERAL VIEWS OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 1A and 1B are schematic illustrations of a spectral imaging system according to some embodiments of the present invention;

FIG. 2A is a schematic illustration showing a representative example of a Bayer filter suitable for some embodiments of the present invention;

FIG. 2B is a schematic illustration exemplifying an imager in embodiments of the invention in which the imager comprises a plurality of pixilated 2D arrays of elementary light detectors;

Figure 3A:
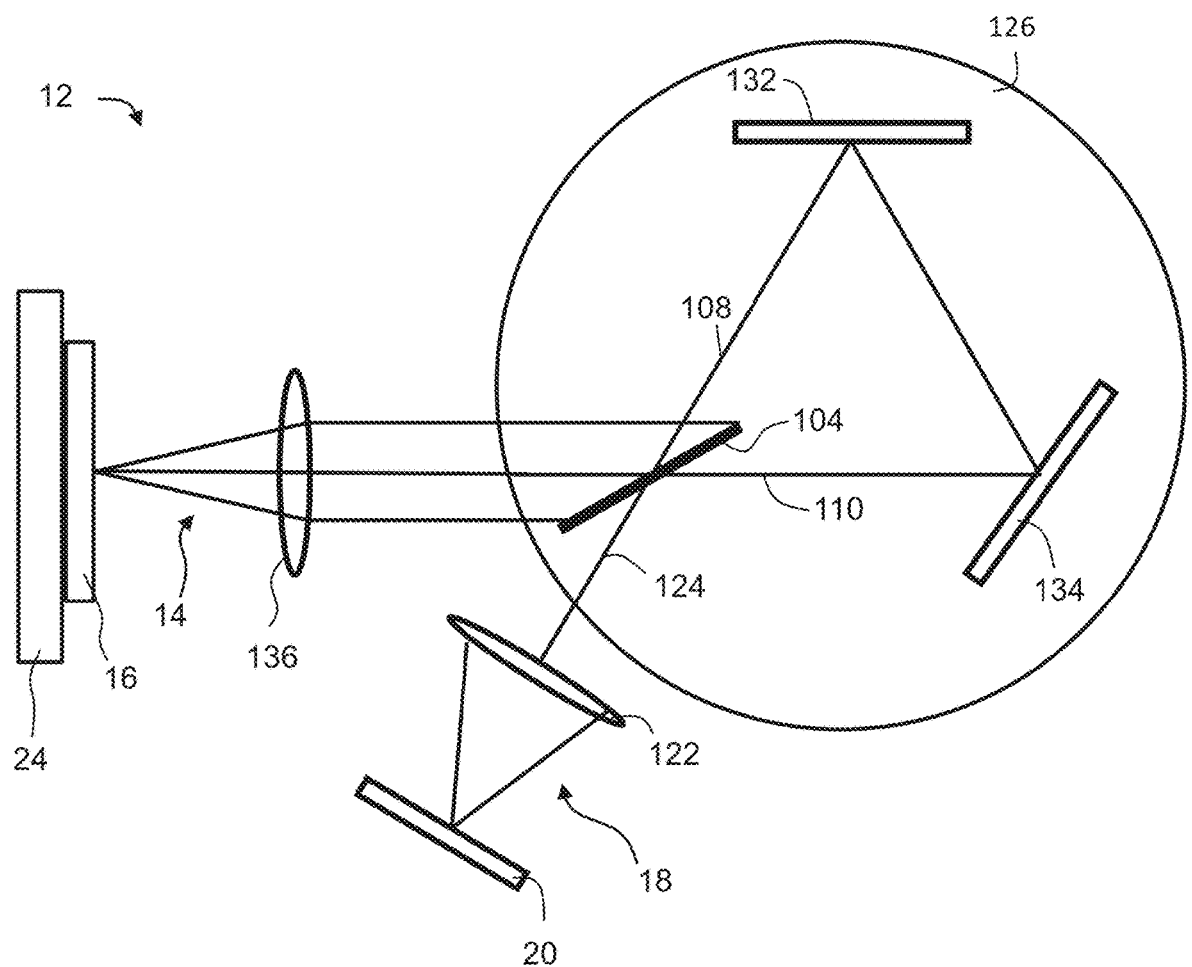
Figure 3B:
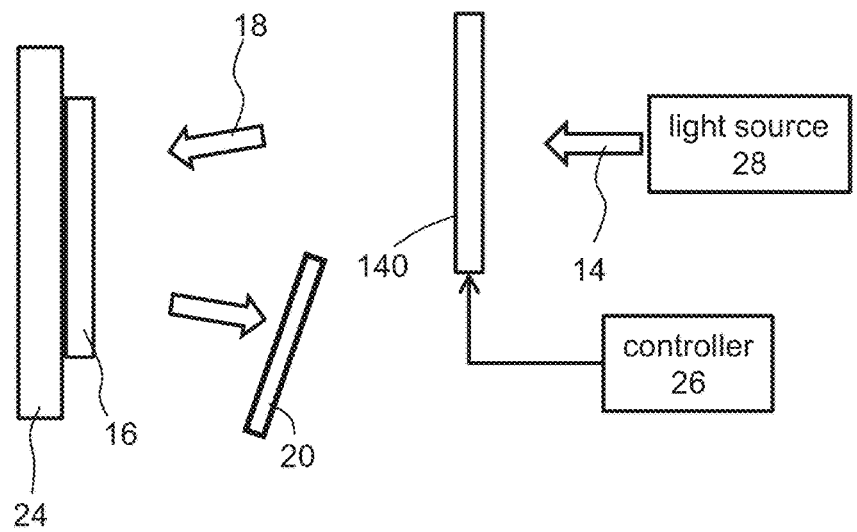
Figure 3C:
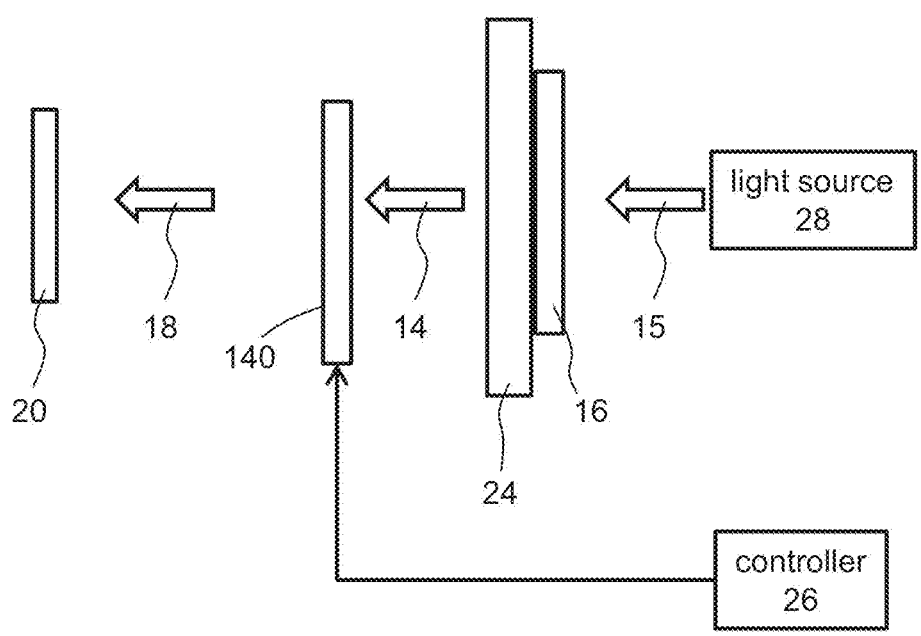
Figure 4A:
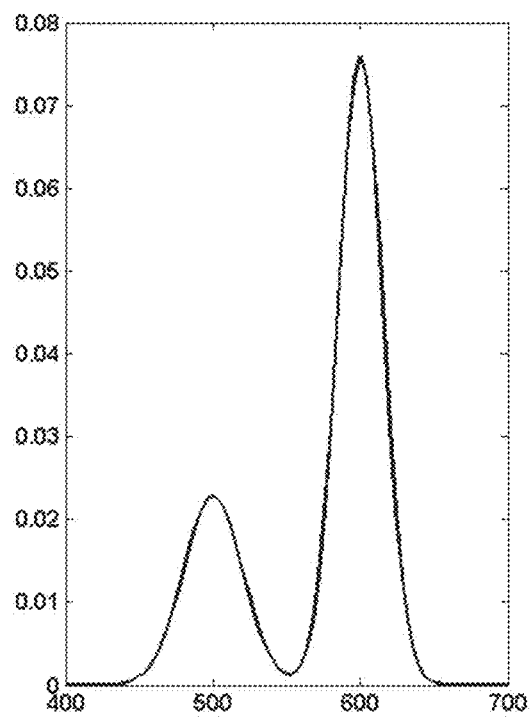
Figure 4B:
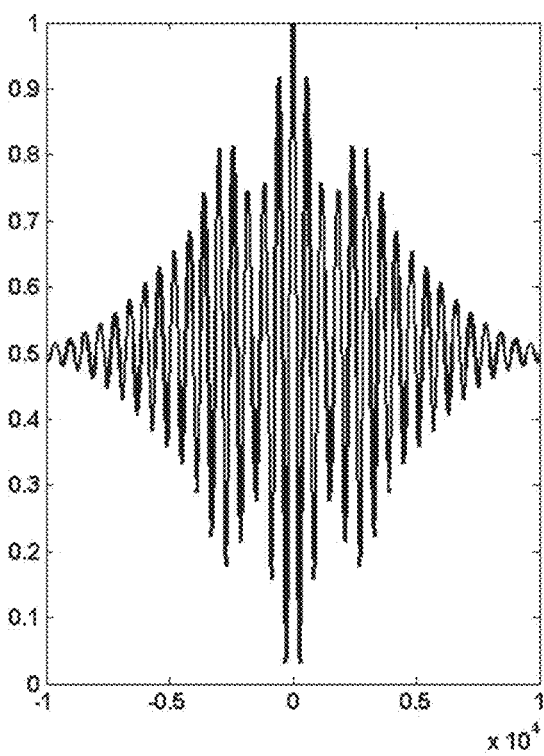
Figure 5:
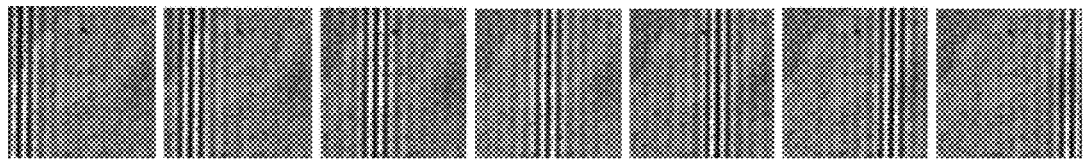
Figure 6:
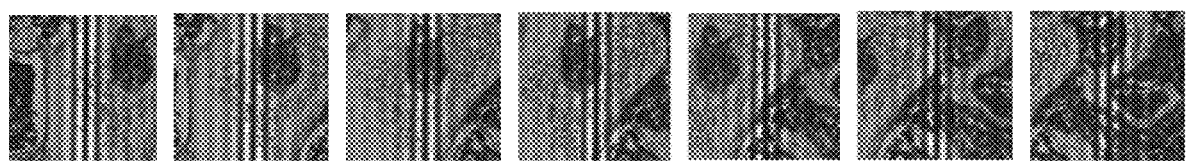
Figure 7:
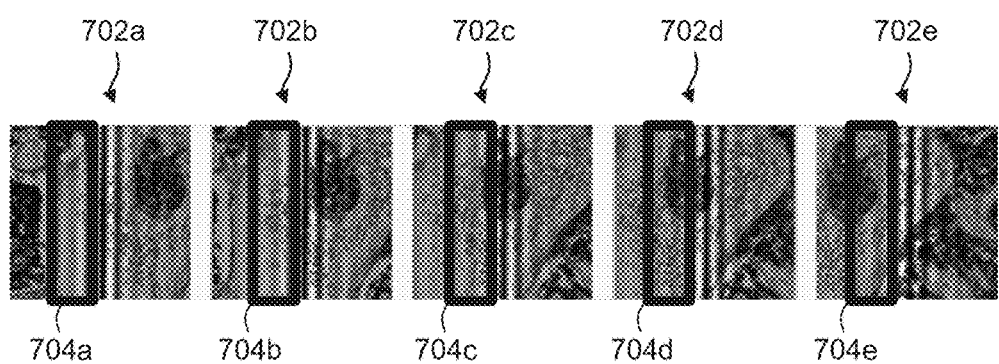
Figure 8:
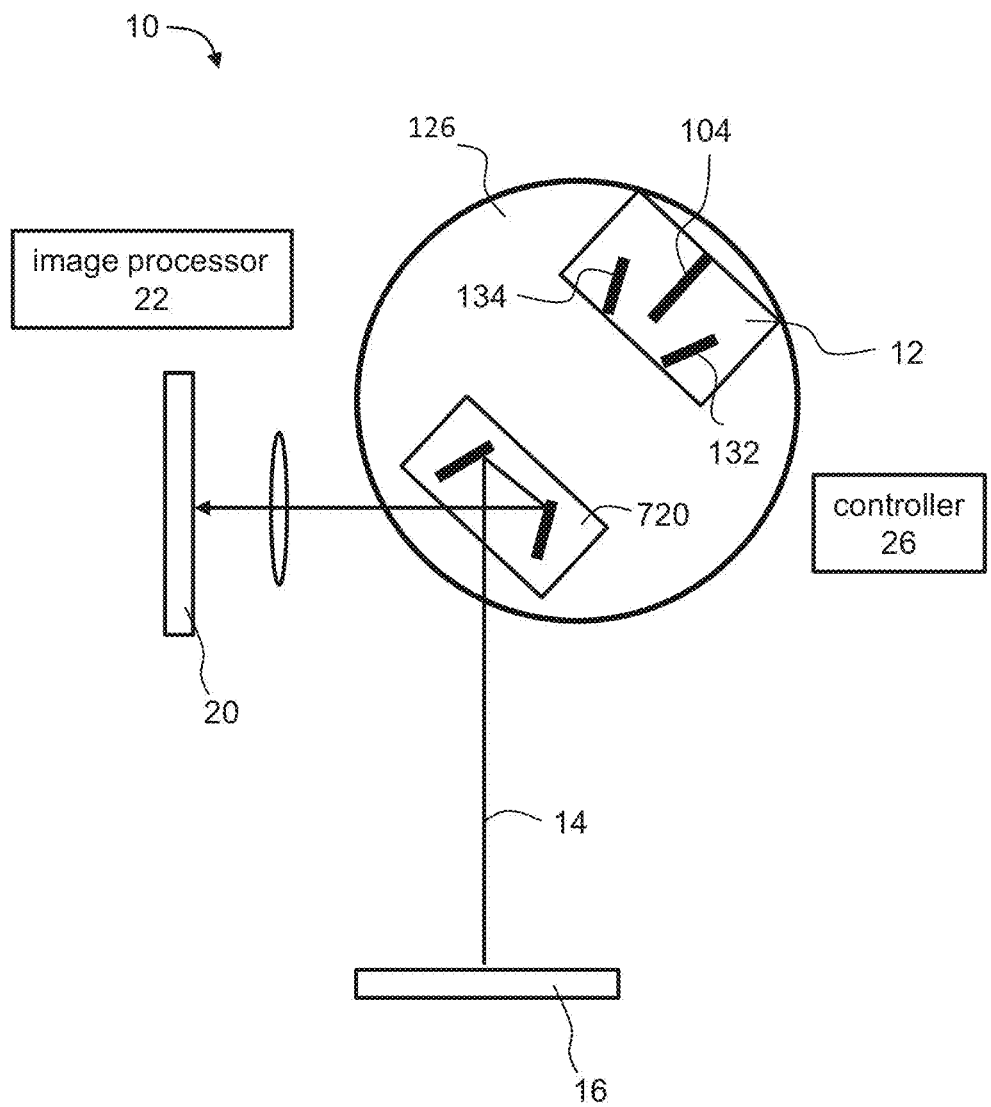
Figure 12A:
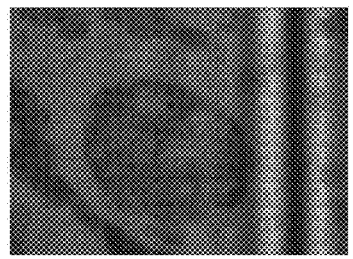
Figure 12B:
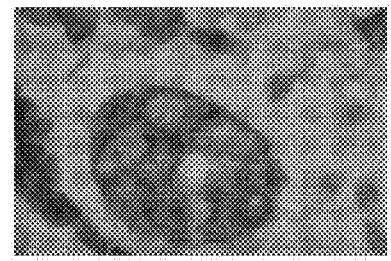

FIGS. 3A-C are schematic illustrations exemplifying several types of optical systems suitable to serve as a sequential optical system, according to some embodiments of the present invention;

FIGS. 4A-B are graphs showing an interferogram (FIG. 4A) and its derived spectrum (FIG. 4B), as extracted by Fourier transformation according to some embodiments of the present invention;

FIG. 5 shows images within a sequence of an OPD-scan, according to some embodiments of the present invention;

FIG. 6 shows images within a sample-scan, according to some embodiments of the present invention;

FIG. 7 is a set of images exemplifying a process for reducing fringe pattern amplitudes, according to some embodiments of the present invention;

FIG. 8 is schematic illustration exemplifying a configuration that allows capturing a direct image according to some embodiments of the present invention;

FIGS. 9A-F show images captured by a color imager having a Bayer filter array within a sequence of an OPD-scan;

FIGS. 10A-F show images captured by a color imager having a Bayer filter array within a sequence of a sample-scan;

FIG. 11A is color image of a sample, obtained according to some embodiments of the present invention by direct imaging;

FIG. 11B is a magnified region-of-interest over the color image of FIG. 9A;

FIG. 11C is a greyscale image obtained by converting the three color channels of FIG. 11B into greyscale levels, according to some embodiments of the present invention;

FIG. 12A shows a greyscale image obtained according to some embodiments of the present invention by indirect imaging; and FIG. 12B shows the image of FIG. 12A after removal of fringe pattern amplitude, according to some embodiments of the present invention.

DESCRIPTION OF SPECIFIC EMBODIMENTS OF THE INVENTION

The present invention, in some embodiments thereof, relates to imaging and, more particularly, but not exclusively, to spectral imaging.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1A:
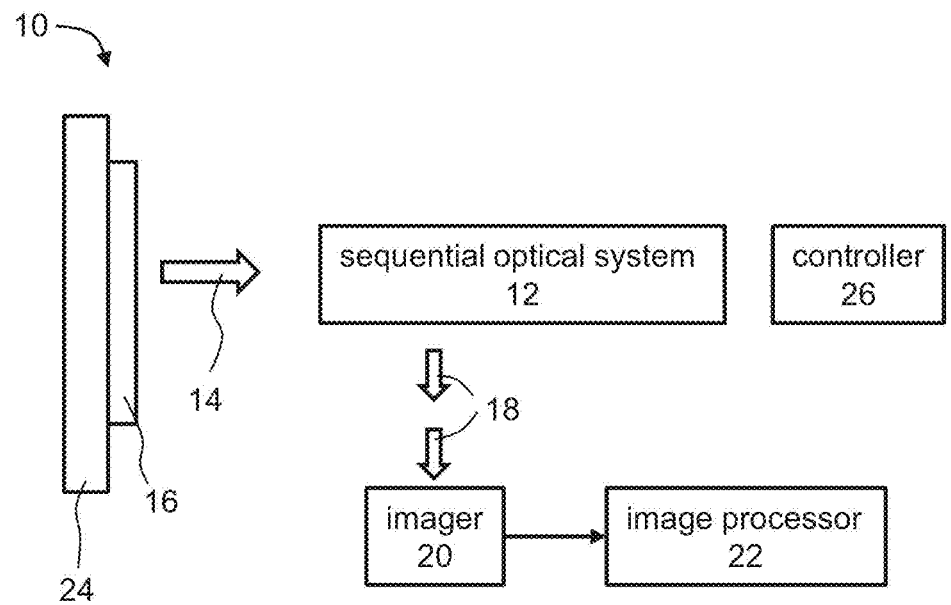
Figure 1B:
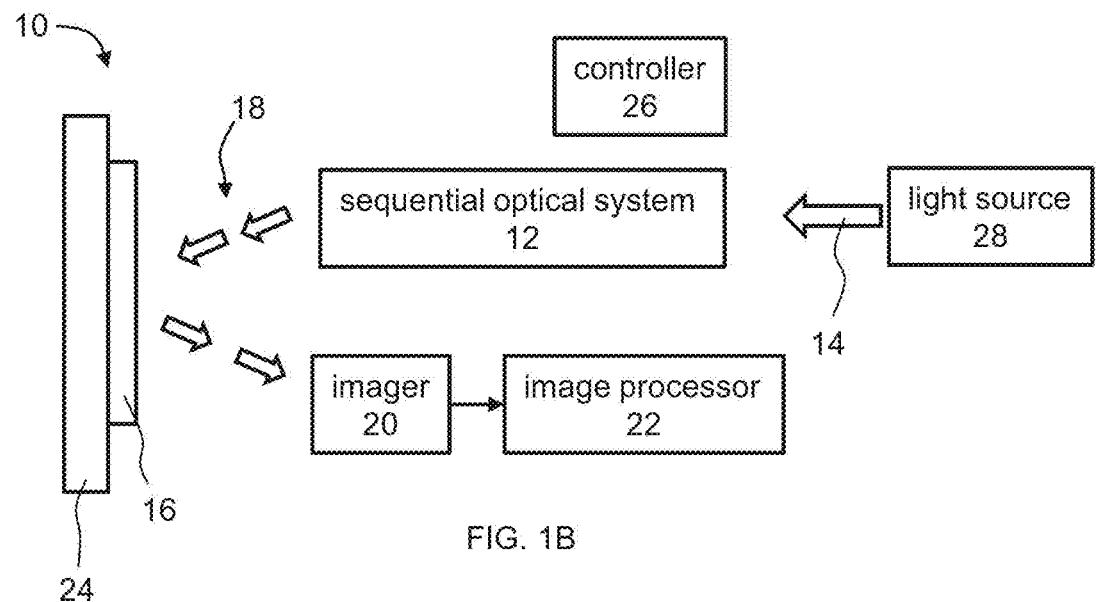

Referring now to the drawings, FIGS. 1A and 1B are schematic illustrations of a spectral imaging system 10, according to some embodiments of the present invention. System 10 comprises sequential optical system 12 that provides a temporal sequence of output light beams 18 describing a scene 16. Each output light beam 18 is characterized by a different value of an optical parameter, as further detailed hereinbelow. In the schematic illustration shown in FIG. 1A, system 12 receives an input light beam 14 from scene 16, and converts it into the sequence of output beams 18. In the schematic illustration shown in FIG. 1B, system 12 receives input light beam 14 from a light source 28, convert it into the sequence of output beams 18, and direct the sequence to scene 16 from which the output beams can be reflected or transmitted. In both alternatives, a sequence of output beams 18 describing the scene is provided.

The sequence is "temporal" in the sense that beams 18 are generated by system 12 non-simultaneously. Thus, system 12 converts the input beam to a first output beam characterized by a first value of the optical parameter, then converts the input beam to a second output beam characterized by a second value of the optical parameter, and so on.

The optical parameter can be of any type which allows generating from a multiplicity of values attainable by that type a spectrum characterized by a set of coefficients respectively corresponding to at least 5 or at least 6 or at least 7 or at least 8 or at least 9 or at least 10 or at least 11 or at least 12 or at least 13 or at least 14 or at least 15 different values of wavelength or frequency.

In some embodiments of the present invention optical parameter is an optical path difference (OPD) between two interfering light beams constituted within the output light beam 18. In these embodiments, system 12 can convert the input beam to a first output beam characterized by a first value of the OPD, then converts the input beam to a second output beam characterized by a second value of the OPD, and so on.

In some embodiments of the present invention optical parameter is a central wavelength or a range of wavelengths contained by output light beam 18. In these embodiments, system 12 can convert the input beam to a first output beam characterized by a first central wavelength or a first range of wavelengths, then converts the input beam to a second output beam characterized by a second central wavelength or a second range of wavelengths, and so on.

Optical parameters other than OPD and wavelength are also contemplated.

The number of output beams provided by system 12, and, consequently, the number of different values of the optical parameter into which the input beam is resolved, is preferably at least 5 or at least 6 or at least 7 or at least 8 or at least 9 or at least 10 or at least 11 or at least 12 or at least 13 or at least 14 or at least 15. The selection of the value of the optical parameter and the timing at which output beams 18 are generated by system 12 is optionally and preferably by controller 26 that typically comprises an electronic circuit for carrying out the control operation. A representative example for an operation principle of system 12 suitable for the present embodiments is described below.

In any of the embodiments described herein, scene 16 can be, for example, a microscope slide carrying cells and/or tissue for in-vitro imaging. Other types of scenes are also contemplated. When scene is sufficiently small (e.g., a microscope slide or the like) system 10 can comprises a locomotion mechanism 24, such as scanning stage, for varying the position of scene 16 relative to system 12.

System 10 optionally and preferably comprises an imager 20 which receives output light beams 18 and responsively generates, for each output light beam, an image signal. In various exemplary embodiments of the invention imager 20 is a color imager. In these embodiments, the image signal is resolved into a plurality of color channels. Thus, the present embodiments provide a plurality of color channels for each output beam, and therefore for each value of the optical parameter that is resolved out of the input beam.

When imager 20 is a color imager, the image signal is typically, but not necessarily, resolved into at least three color channels. When there are three or more color channels, three color channels are optionally and preferably in the visible range, for example, a red color channel, a green color channel and a blue color channel. The present embodiments also contemplate a configuration in which the imager provides image signal resolved into four color channels. For example, one of the four color channels can be in the infrared range (preferably the near infrared range) and each of the remaining three color channels can be in the visible range.

A "visible range", as used herein, refers to a range of wavelengths from about 400 nm to about 700 nm.

An "infrared range", as used herein, refers to a range of wavelengths from about 700 nm to about 1 mm.

A "near infrared range", as used herein, refers to a range of wavelengths from about 700 nm to about 1400 nm.

A representative example of a set of color channels suitable for the present embodiments is a red channel, corresponding to red light (e.g., light having a spectrum having an apex at a wavelength of about 580-680 nm), a green channel, corresponding to green light (spectrum having an apex at a wavelength of from about 500 to about 580 nm), and a blue channel, corresponding to blue light (spectrum having an apex at a wavelength of from about 420 to about 500 nm). Such a set of channels is referred to herein collectively as RGB channels.

Another representative example of a set of color channels suitable for the present embodiments is a red channel, a green channel and a blue channel as detailed above, and also an infrared channel corresponding to near infrared light (spectrum having an apex at a wavelength of from about 800 to about 900 nm).

Imager 20 can be of any types known in the art. Typically, imager 20 can include one or more pixilated arrays of elementary light detectors, e.g., one or more CCD arrays or one or more CMOS arrays.

When imager 20 is a color imager, it can be in the form of a single pixilated two-dimensional array of elementary light detectors covered by a color filter array. In these embodiments, the image signal provided by imager 20 is arranged in a plurality of picture-elements respectively corresponding to the elementary light detectors.

Figure 2A:
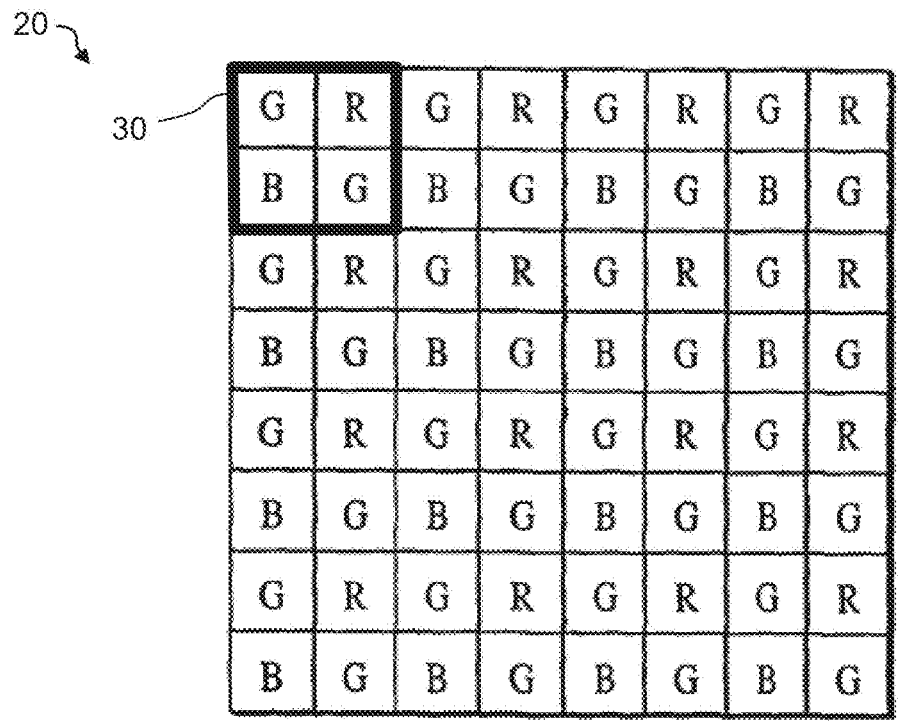

Preferably, the color filter array is a Bayer filter. A representative example of a Bayer filter suitable for the present embodiments is illustrated in FIG. 2A. In FIG. 2A, "R" represents a red color filter element, "G" represents a green color filter element, and "B" represents a blue color filter color filter element. As shown, the green information is sampled at a higher frequency. Shown in FIG. 2A is an exemplary 2×2 sub-array 30 that includes a red element a green element and two green elements and that corresponds to a picture-element in the image signal. It is to be understood that other color filter arrays (e.g., four-color filter, a CYYM filter array, a CYGM filter array, an RGBW filter array, etc.) are also contemplated according to some embodiments of the present invention.

Imager 20 can alternatively include plurality of pixilated two-dimensional arrays of elementary light detectors, such as, but not limited to, a 3-sensor imager (e.g., a 3-CCD or a 3-CMOS). In these embodiments, system 10 comprises an optical element that splits the output light beam to plurality of color channel and to direct different color channels to different arrays. Each picture-element of the image signal in these embodiments corresponds to a group of corresponding elementary light detectors in different arrays.

Figure 2B:
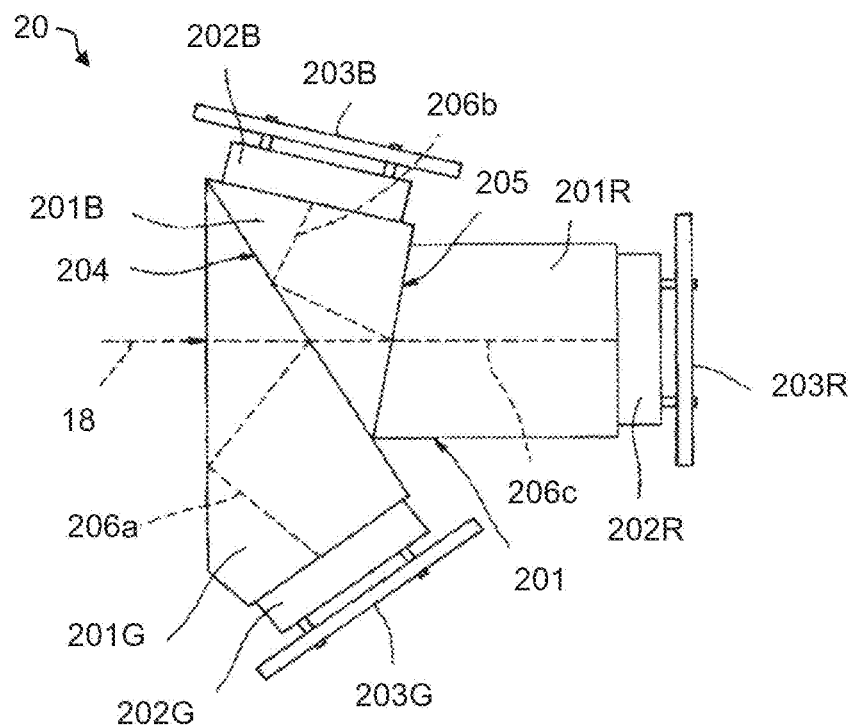

FIG. 2B is a schematic illustration exemplifying imager 20 in embodiments in which imager 20 comprises a plurality of pixilated 2D arrays of elementary light detectors. In FIG. 2B, imager 20 is based on a 3-sensor technology. In this representative illustration, imager 20 comprises an optical element 201 having three prism members 201R, 201G, and 201B, which are bonded together in close contact with one another. Element 201 separates the incident light into three color components (R, G and B, in the present example). Bonded interfaces 204 and 205 on prism members 201R, 201G and 201B serve as dichroic mirrors. Three pixilated 2D arrays of elementary light detectors 202R, 202G and 202B are individually mounted at the light-outgoing surfaces of the three prism members 201R, 201G and 201B. Light beam 18 incident on element 201 is separated by the dichroic mirrors 204, 205 into three color components, shown as light beams 206a, 206b and 206c which are respectively received by their corresponding pixilated 2D arrays. Image sensor boards 203R, 2036 and 203B pickup signals generated by arrays and optionally perform basic signal processing operations, e.g, image flip, and the like.

System 10 also comprises an image processor 22 that receives the image signals from imager 20 (one signal for each output beam in the temporal sequence) and processes the image signals to construct a static spectral image of scene 16. Image processor optionally and preferably comprises a hardware circuit, preferably a dedicated hardware circuit, that is constructed to perform the calculations and image processing operations described herein.

The spectral image typically includes spectral data and spatial data. The spatial data is preferably two-dimensional, for example, in the form of a two-dimensional array of picture-elements (e.g., pixels). The spectral data preferably includes a spectrum (for example, a wavelength spectrum) for each picture-element of the spatial data. Thus, a spectral image is typically a three-dimensional (3D) dataset including two spatial dimensions and one spectral dimension. Such dataset is represented mathematically as $I(x,y,\lambda)$, where x and y are pointers to the picture-elements (e.g., positions over a rectangular grid), $\lambda$ the wavelength, and I is the intensity associated with each picture-element and wavelength.

Before providing a further detailed description of the spectral imaging technique of the present embodiments, attention will be given to the advantages and potential applications offered thereby.

The advantage of using a color imager in system 10 is that the color information can be gathered substantially without degradation of spatial resolution. It was found by the present Inventor that in spectral imaging it is more difficult than in direct imaging technique to maintain uniformity along the spatial dimensions. It was found by the present Inventor that traditionally acquired spectral images may suffer from various imperfections, including degraded point spread function (PSF), and non-uniformity of intensity and/or focus along the spatial dimensions. The present Inventor also realized that the process of acquiring the data for reconstructing a spectral image is time consuming, and that known techniques to improve speed impose compromises on the spatial and/or spectral resolution of the spectral image.

Another advantage of using a color imager in system 10 is that it allows generating a color image from the scene while preserving the capability to construct a spectral image with enhanced spatial and spectral resolution.

Another advantage of using a color imager in system 10 is that it allows relatively fast scanning of large regions in the scene, for example, whole slide imaging in analysis of microscope slides carrying cells and/or tissue for in-vitro imaging.

Another advantage of using a color imager in system 10 is that it allows performing color analysis and constructing a spectral image on a region-of-interest selected based on this analysis. For example, color analysis can be performed for the purpose of identifying tumor regions on a microscope slides, and a spectral image of these identified tumor regions be successively constructed for advanced quantitative analysis.

An additional advantage of the system of the present embodiments is that the system can provide a spectral image with reduced or without the effect of visual stripes corresponding to the interference of the two beams.

Reference is now made to FIGS. 3A-C which are schematic illustrations exemplifying several types of optical systems suitable to serve as sequential optical system 12, according to some embodiments of the present invention.

FIG. 3A schematically illustrates sequential optical system 12 in an embodiment of the invention in which system 12 is an interferometer system. In these embodiments, system 12 each output light beam 18 constitutes two interfering light beams characterized by optical path difference (OPD) therebetween. Controller 26 (not shown, see FIGS. 1A-B) varies the OPD. This can be achieved by varying the relative position and/or orientation between the scene and one or more components of interferometer system 12, as further detailed hereinbelow.

The illustration in FIG. 3A is of a type of interferometer known as the Sagnac type. In this interferometer, the OPD varies with the angle of incidence of the incoming radiation. Typically, the OPD increases with the angle of incidence, and the relation between the OPD and the angle of incidence can be approximated as a linear relation. While the embodiments below are described with a particular emphasis to Sagnac interferometer, it is to be understood that embodiments of the present invention can be applied also to many other types of interferometers, such as, but not limited to, a Michelson interferometer, a Mach-Zehnder interferometer, and a Polarimetric interferometer.

Interferometer system 12 optionally and preferably comprises a lens system 136 through which input light beam 14 passes. Lens system 136 preferably collimates beam 14. Optionally, lens system 136 also serves as a magnifying objective lens system. The objective lens system can be of any type, including, without limitation, dry, oil-immersion, water-immersion, water-dipped and the like. The objective lens system can provide any magnification from ×1 to ×100. Input light beam 14 can be reflected from the scene, scattered off objects in the scene, transmitted through the scene or emitted by objects in the scene.

Interferometer system 12 typically also includes a beam splitter 104 configured to split input light 14 beam into secondary light beams. Shown in FIG. 3A are light rays 108 and 110 that are constituted by the secondary light beams. For example, each of light rays 108 and 110 can be a central light ray of the respective secondary light beam. For clarity of presentation, the secondary light beams themselves are not shown, but the skilled person would know how to adjust the drawing to show the light beam that constitutes each of rays 108 and 110 (for example, by drawing light rays that are parallel to rays 108 and 110).

At least a portion of each of the secondary beams, particularly the portions that include rays 108 and 110, is redirected by a reflector. Thus, in various exemplary embodiments of the invention system 12 comprises two or more reflectors. In the illustration of FIG. 3A, system 12 comprises a pair of reflectors 132 and 134. In this illustration, which is not to be considered as limiting, ray 108 is reflected off reflector 132 and ray 110 is reflected off reflector 134. Following the reflections, ray 108 continues to reflector 134, and ray 108 continues to reflector 132. From the reflectors 132 and 134 the light rays 108 and 110 are reflected back to pass the beam splitter 104 again. At this stage, they have experienced OPD. A superposition of the secondary beams, after they have experienced OPD, is shown at 124 which can represent, for example, a central light ray of output beam 18. A portion of the superposition beam may be reflected or transmitted back to the scene. Optionally and preferably system 12 includes a focusing element 122 that focuses output beam 18 onto imager 20.

Interferometer system 12 can further comprise a movable block 126 (e.g., a plate or a disc) configured for establishing a motion relative to the scene 16. The relative motion can be continuous or in steps, as desired. The relative motion can be a relative rotary motion, e.g., rotation of beam splitter 104 together with reflectors 132 and 134, and/or a relative translational motion, e.g., a translational motion of system 12 relative to scene 16. A translational motion of scene 16 relative to system 12 is also contemplated, for example, by means of mechanism 24. Further contemplated are embodiments in which a combination of rotary motion and translational motion is employed. The relative motion between the scene and the components of the interferometer system is preferably controlled by the controller (not shown in FIG. 3A, see FIGS. 1A-B).

The information that is required for calculating the spectrum is contained in the function I(OPD) that expresses the intensity as a function of the OPD. The spectrum can be obtained from I(OPD), for example, by Fourier transform, for example, according to the following equation:

$$I(\sigma) = \sum_{i=1}^{N} I(OPD_i) \exp(-j2\pi\sigma OPD_i)$$

Where $\sigma=1/\lambda$ is the wavenumber, j is the imaginary unit number, i is the index of the OPD and N is the total number of OPDs for which the intensity is measured. Optionally, one or more pre- and/or post-processing operations can be employed. Representative examples including, without limitation, phase correction, apodization and zero filling. Further details can be found in R. J. Bell, "Introductory Fourier transform spectroscopy", 1972, London: Academic Press. An example of a measured interferogram and its derived spectrum, as extracted by Fourier transformation, is shown in FIGS. 4A-B.

The intensities as a function of the OPD can be obtained by scanning.

In some embodiments an OPD-scan process is employed. In these embodiments, the reflectors 132 and 134 and beam splitter 124 are rotated, while all the other optical elements remain static. The measurement is preferably executed such that for each small rotation, a single image is captured, until a sufficient number of images are captured. The rotation results in a change in the angle for each beam and the pattern travels along the horizontal axis. On the other hand, the image itself does not move, so that all the intensities that are measured can be collected for each pixel, and the interferogram can be built. The interferograms extracted at each pixel are optionally and preferably Fourier transformed and the collection of spectra of all pixels constructs the spectral image. A subset of images within the sequence of the OPD-scan method is shown in FIG. 5.

In some embodiments of the present invention sample-scan process is employed. In these embodiments, the interferogram is kept fixed, and the sample is scanned, optionally and preferably in a direction orthogonal to the orientation of the interference lines (fringes). In such a process, the image can be shifted, but the interference pattern is fixed. In this process, the interferogram for each pixel can be constructed based on the pixel-shift from one image to another, wherein the intensities of the detector's pixels are collected. Thus, for each of a plurality of points of the sample, the intensities at different OPDs are collected. This can be followed by Fourier transformation and construction of the spectral image. A subset of images within the sequence of the sample-scan method is shown in FIG. 6.

It is recognized by the present inventors that although these two processes provide for each point of the sample an interferogram to be transformed to its spectrum, these two processes differ from each other. The OPD changes with the angle θ of incidence of the input light beam on the beam splitter. This change is to a good approximation linear and can be written as OPD=Cθ, where C is a constant. The horizontal end-pixels, for which the angle is maximal thus experience the largest OPD, and the spectral resolution Δλ obtainable by the sample-scan process is at least $\lambda^2/(C\theta_{max})$. In the OPD-scan process, that maximal obtainable angle is larger than that achieved by the image-scan process, and depends more on the optical geometry of the interferometer itself. The actual value of $\theta_{max}$ depends on the maximal angle that the interferometer rotate before a vignetting is reached.

FIGS. 3B and 3C are schematic illustrations of system 12 in embodiments in which sequential optical system 12 comprises a tunable filter. FIG. 3B illustrates an embodiment in which light source 28 generates input light beam 14 characterized by a wide spectral range. Beam 14 enters a tunable optical filter 140 (for example, acousto-optic tunable filter, liquid crystal tunable filter, etc.). Controller 26 commands filter 140 to tune to the first central wavelength. Filter 140 filters out a portion of the spectrum of beam 14 so that the spectrum of the output beam 18 exiting filter 140 is narrower than the spectrum of beam 14. Controller 26 then commands filter 140 to tune to the next wavelength and so that another output beam is generated. The output beams 18 arrive at scene 16 and are transmitted or reflected by scene 16 towards imager 20 for example, using a lens system (not shown). FIG. 3C illustrates an embodiment in which light source 28 generates source light beam 15 characterized by a wide spectral range. Beam 15 passes through the scene 16 to form input light beam 14 that describes the scene. Beam 14 enters tunable optical filter 140. Controller 26 commands filter 140 to tune to the first central wavelength. Filter 140 filters out a portion of the spectrum of beam 14 so that the spectrum of the output beam 18 exiting filter 140 is narrower than the spectrum of beams 15 and 14. Controller 26 then commands filter 140 to tune to the next wavelength and so that another output beam is generated. The output beams 18 continue from filter 140 to imager 20, for example, using a lens system (not shown).

Following is a description of preferred imaging and processing procedures according to some embodiments of the present invention. The procedures are suitable for any type of optical system 12.

In order to calculate a spectrum, a sufficient number of intensities I each measured at a different value of the optical parameter range (e.g., a different OPD of the interferometer, or a different characteristic central wavelength of the tunable filter) is preferably collected.

In embodiments in which imager 20 is a color imager, the image processor preferably converts the image data constituted by the image signals to greyscale levels that represent the intensities I. This can be done in more than one way. When imager 20 comprises a filter array, the conversion can comprise binning of neighboring picture-elements in a non-overlapping manner. The binning "non-overlapping" in the sense that the intensity provided by each elementary light detector of the array is not used for determining the greyscale level of more than one picture-element. A representative example of non-overlapping binning is a process in which sub-array is integrated or summed and the result of this integration can be assigned as the greyscale level of the corresponding picture-element. This provides a spatial resolution that is reduced with respect the spatial resolution attainable by the elementary light detector of the array. For example, when the sub-array is a 2×2 sub-array (e.g., array 30, see FIG. 2A), the binning operation reduces the spatial resolution so that the number of resultant greyscale elements of the detector array is divided by a factor of 4.

An alternative technique for converting the image data to greyscale levels includes, for each light detector of the array, integrating data received from light detector neighboring that detector and assigning to a picture-element corresponding to that detector a greyscale level based on the integration. A representative example of such an embodiment is a process in which a sub-array is integrated or summed and the result of this integration is assigned as the greyscale level of a picture-element that corresponds to one light detector (e.g., the upper-left light detector) of that sub-array. This maintains the spatial resolution of the light detector array.

When imager 20 comprises a plurality of pixilated 2D arrays of elementary light detectors (e.g., as illustrated in FIG. 2B), the conversion of image data to greyscale levels can be achieved, by integrating, for each picture-element, over color channels obtained from respective elementary light detectors of the 2D arrays and being associated with that picture-element, and assigning to the picture-element a greyscale level based on the integration. For example, when the imager comprises a first array, a second array and a third array (e.g., for red, green and blue color channels), the greyscale level of the picture-element at position (x, y) can set to be R(x,y)+G(x,y)+B(x,y), where R(x,y), G(x,y) and B(x,y) are, respectively, the intensities measured by the elementary light detectors at position (x, y) of the first, the second and the third arrays.

In any of the embodiments in which imager 20 is a color imager, the image processor optionally corrects the intensity level of each of at least some of the picture-elements of the spectral image using local intensity associated with a respective color channel in the image data constituted by the image signals. The correction is optionally and preferably features a local correction factor that represents the ratio between the local intensity and the integrated intensity at each picture-element to which the correction is applied. The corrected spectral image $C_{s(x,y,\lambda)}$ can be written mathematically as:

$$C_{s(x,y,\lambda)} = \frac{R_{s(x,y,\lambda)}}{I_{s(x,y)}} * I_{x,y}$$

where $R_{s(x,y,\lambda)}$ is the measured spectrum at the picture-element located at (x, y), $I_{s(x,y)}$ is defined as $I_{s(x,y)}=\int_\lambda R_{s(x,y,\lambda)}d\lambda$, and $I_{x,y}$ is the intensity of the picture-element located at (x, y). Preferably, but not necessarily, $I_{x,y}$ is obtained by direct imaging technique, as described hereinunder with reference to FIG. 8. Alternatively, $I_{x,y}$ is obtained by indirect imaging technique as described hereinunder with reference to FIG. 7. It was found by the present inventors that the corrected spectral image $C_{s(x,y,\lambda)}$ has high spatial quality in terms of spatial sharpness and correct intensity representation without degrading the local spectral signature representation of image elements.

In any of the embodiments in which imager 20 is a color imager, it is preferred to maintain the local intensity ratio between picture-elements of different color channels. The advantage of these embodiments is that they provide image smoothness. For example, when there are, say, a red color channel, a green color channel and a blue color channel, it is preferred to maintain, locally, for at least some regions within the image, the ratio between the intensities of the red, green and blue sub-spectra that are stored in the red, green and blue picture-elements that compose that region. This is preferably achieved by applying an intensity correction factor as will now be explained.

When imager 20 includes a filter array (e.g., as described above with respect to FIG. 2A), the image processor applies, for each picture-element that correspond to a color channel, an intensity correction factor selected to ensure that a ratio between the intensity corresponding to that color channel and the integrated intensity corresponding to the color channels at a region containing the picture-element is preserved. For example, a uniform image area can be used and the values of each color channel (e.g., red, green and blue color channels) can be stored. Then, the total intensity as well as the ratio between the intensities of the individual color channels is maintained within the spectrum of each picture-element.

Consider the following example, which is not intended to be limiting, suitable for the case in which the filter array is a Bayer R-G-G-B filter.

Let $I_{G_1}$ be the intensity value measured by the elementary light detector that is at location (x,y), and that is behind a green element of the Bayer array. The expression $I_S=\int_\lambda S(\lambda)d\lambda$ is the integrated intensity of the spectrum over the 2×2 sub-array containing the location (x,y), and therefore represents the non-corrected intensity of the spectrum at location (x,y). The expression $I_S^{G_1}=\int_\lambda S(\lambda)\cdot S_G(\lambda)d\lambda$, where $S_G(\lambda)$ is the characteristic spectral sensitivity of the elementary light detectors behind the green elements of the array sensor, is the partial intensity that corresponds to the green channel. Let $I_{RGB}$ be a greyscale level intensity as provided by a binning or summing procedure applied to the 2×2 region containing the location (x,y). Typically, $I_{RGB}$ is a combination (linear or non-linear) of the intensities picked by the individual detector elements at the respective 2×2 region. For example, when a linear combination is employed for a Bayer R-G-G-B filter array, $I_{RGB}$ can be defined as $I_{RGB}=\alpha_1 R+\alpha_2 G_1+\alpha_3 G_2+\alpha_4 B$, where $\alpha_i$, i=1, . . . , 4 are weight coefficients, and R, $G_1$, $G_2$ and B are the intensities of the red, green and blue detector elements in the 2×2 region. In some embodiments all values of the coefficients $\alpha_i$ are the same (in which case $I_{RGB}$ is a non-weighted sum of intensities), and in other embodiments at least two of the coefficients $\alpha_i$ are different from each other (in which case $I_{RGB}$ is a weighted sum of intensities).

In various exemplary embodiments of the invention ratio between the intensity of a picture-element (e.g., a pixel) and the integrated intensity of a sub-array of the filter array (e.g., a 2×2 sub-array) approximately equals the ratio between the corresponding intensities in the spectral image. For example, the ratio of the intensity of the green (x,y) pixel to the intensity within the 2×2 sub-array, approximately equals the ratio between the integrated green intensity within the spectrum at location (x,y) and the total intensity of the spectrum at this point. This can be written mathematically as:

$$\frac{I_{G_1}}{I_{RGB}} = \frac{I_S^{G_1}}{I_S}$$

Using this desired relation the local intensity correction factor $C_I(x,y)$ applied to the picture-element at location (x,y) can be written as:

$$C_I(x, y) = \frac{\frac{I_S}{I_{RGB}} \cdot I_{G_1}}{I_S^{G_1}}$$

A similar procedure can be applied to image signal provided by an imager having other types of filter arrays.

In any of the embodiments described herein the image processor 22 can apply image uniformity correction to spatial information in the spectral image, for reducing or eliminate non-uniformity in the two spatial dimensions of the spectral image. This improves the intensity normalization of the image. Image uniformity correction can be applied either before the construction of the spectral image, for example, directly on the image signal provided by the imager, or after the construction of the spectral image, by applying the correction to the two spatial dimensions namely of I(x, y, λ). Image uniformity correction can also be applied to an image signal provided by imager 20 in response to direct imaging wherein light beams incident on imager 20 without passing through system 12. In these embodiments, the result of the image uniformity correction applied to the signal obtained by direct imaging can be used as a reference to the image uniformity correction applied to image signals generated in response to light passing through system 12.

An image uniformity correction factor C can be calculated according to some embodiments of the present invention using the following relation:

$$C = S * \frac{m}{R},$$

where R is a reference image signal, S is the uncorrected image signal (e.g., the raw signal provided by imager 20 and m is the average intensity value overall picture-elements of the reference image signal R. The reference image signal R can be obtained, for example, by imaging a reference scene for which the uniformity level is known. Typically, but not necessarily, R is obtained by imaging a white scene.

The system of the present embodiments can also be used for obtaining a 2D color image of the scene, wherein the 2D image includes color information generated by the color imager 20, but not by the sequential optical system. Specifically, the number of color channels of the color image in these embodiments is equal to or less than the number of color channels providable by imager 20.

In some embodiments of the present invention the 2D image is captured from a single output light beam exiting system 12. A color 2D image captured in this way is referred to as an "indirect color image," because it is captured after the light beam from the light source or scene has passed through system 12. When system 12 comprises an interferometer system, the output light beam provided by system 12 constitutes an interference pattern also referred to as a fringe pattern. Preferably, image processor 22 reduces the amplitudes of fringe pattern. This can be achieved by operating locomotion mechanism 24 (e.g., by controller 26) to shift a relative position between scene 16 and system 12, wherein image processor is 12 extracts, for each relative position, a portion of the image in which the fringe pattern amplitudes are reduced relative to other portions of the image.

The process is illustrated in FIG. 7, which exemplify five images 702a-702e captured by imager 20, wherein each image correspond to a different position of scene 16 relative to system 12. Respectively marked on images 702a-702e are regions of interest (ROIs) 704a-704e. The ROIs are preferably off-center relative to images 702a-702e, since in the off-center parts of the images the amplitudes of the fringe pattern are reduced, relative to the center. Preferably, but not necessarily, the position, shape and size, relative to images 702a-702e, of each of ROIs 704a-704e is the same. The processor 22 extracts the portions of the images that are encompassed by the respective ROIs, and tiles the extracted portions. Preferably, the tiling process comprises removing periodic parts of in the extracted portions. This can be done, for example, by applying a 2D-Fourier-Transform technique, as disclosed in, e.g., Digital Image Processing, Rafael C. Gonzalez, Richard E. Woods, 1993, pp, 201-213.

Another way to obtain a 2D color image of the scene, is by a technique referred to herein as "direct imaging". In direct imaging, a color 2D image is captured from light beam that does not pass through system 12. A color 2D image captured in this way is referred to as "direct image". A representative illustration of a configuration that allows capturing a direct image is illustrated in FIG. 8. The schematic illustration is for the case in which in embodiments in which system 12 comprises an interferometer system, but the ordinarily skilled person would know how to adjust the description for other types of sequential optical systems.

Shown in FIG. 8 is a configuration in which system 12 (an interferometer system, in the present example) as well as an additional optics 720 are mounted on the same movable block 126. Optics 720 is typically a redirecting optics constituted for redirecting input light beam 14 directly onto imager 20, preferably via focusing element 122 so that beam 14 is focused on imager 20. The switching between indirect imaging (via system 12) and direct imaging (not via system 12) can be achieved by rotating block 126. In the present example, optics 720 and system 12 are antipodal so that the switching is achieved by a 180° rotation of block 126, but other switching scenarios are also contemplated. The switching (e.g., rotation of block 126) is preferably controlled by controller 26. Image processor 22 receives the image signal generated by imager 20 responsively to the direct focus, and provides a color image of scene 16 based on the image signal.

As used herein the term "about" refers to ±10%.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

Examples

Reference is now made to the following examples, which together with the above descriptions illustrate some embodiments of the invention in a non limiting fashion.

A prototype spectral imaging system having an interferometer system as a sequential optical system, an RGB color imager, and a stage for switching between direct and indirect imaging has been constructed. Images captured by the prototype system are shown in FIGS. 9A-12B.

Specifically, FIGS. 9A-F show images captured by a color imager having a Bayer filter array within a sequence of an OPD-scan, where FIGS. 9A-9C are the color images as captured by the color imager, and FIGS. 9D-9F are the corresponding images after the image data has been converted to greyscale levels; FIGS. 10A-F show images captured by a color imager having a Bayer filter array within a sequence of a sample-scan, where FIGS. 10A-10C are the color images as captured by the color imager, and FIGS. 10D-10F are the corresponding images after the image data has been converted to greyscale levels; FIG. 11A is color image of the sample, obtained by direct imaging, FIG. 11B is a magnified region-of-interest over the color image of FIG. 9A, FIG. 11C is a greyscale image obtained by converting the three color channels of FIG. 11B into greyscale levels by a binning procedure, FIG. 12A shows a greyscale image obtained by indirect imaging, and FIG. 12B shows the image of FIG. 12A after removal of fringe pattern amplitude.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A spectral imaging system, comprising:
a sequential optical system providing a temporal sequence of output light beams describing a scene;
a color imager receiving said output light beams and being configured to responsively generate, for each output light beam, an image signal that is spatially resolved into a plurality of color channels; and
an image processor configured for collectively processing said image signals to convert image data constituted by said image signals to greyscale levels so as to construct a static spectral image of said scene, having a plurality of picture-element and a spectrum for each picture-element;
wherein said conversion of said image data to greyscale levels comprises binning neighboring picture-elements corresponding to different color channels in a non-overlapping manner.

2. The system according to claim 1, wherein said sequential optical system comprises an interferometer system, wherein each output light beam constitutes two interfering light beams characterized by a different optical path difference (OPD) therebetween.

3. The system according to claim 1, wherein said sequential optical system comprises a tunable optical filter, wherein each output light beam is characterized by a different central wavelength of said tunable optical filter.

4. The system according to claim 1, wherein said image processor is configured to apply for each picture-element that correspond to a color channel, an intensity correction factor selected to ensure that a ratio between an intensity corresponding to said color channel and an integrated intensity corresponding to a plurality of color channels in a region of the image containing said picture-element is preserved.

5. The system according to claim 1, wherein said color imager comprises a single two-dimensional array of elementary light detectors covered by a color filter array.

6. The system according to claim 5, wherein said color filter is a Bayer filter.

7. The system according to claim 1, wherein said color imager comprises a plurality of two-dimensional arrays of elementary light detectors, wherein the system comprises an optical element constructed for splitting said output light beam to said plurality of color channels and to direct different color channels to different arrays.

8. The system according to claim 1, wherein said color imager comprises a single two-dimensional array of elementary light detectors covered by a color filter array.

9. The system according to claim 1, wherein said color imager comprises a plurality of two-dimensional arrays of elementary light detectors, wherein the system comprises an optical element constructed for splitting said output light beam to said plurality of color channels and to direct different color channels to different arrays.

10. The system according to claim 1, wherein said temporal sequence of output light beams comprises a sequence of at least five different output light beams.

11. The system according to claim 1, wherein said plurality of color channels is three color channels.

12. The system according to claim 11, wherein each of said three color channels is in the visible range.

13. The system according to claim 1, wherein said plurality of color channels is four color channels.

14. The system according to claim 13, wherein one of said four color channels is in the infrared range and each of a remaining three color channels is in the visible range.

15. The system according to claim 1, wherein said image processor is configured to apply image uniformity correction to spatial information in said spectral image.

16. The system according to claim 1, wherein said image processor is configured to correct an intensity level of each of at least some picture-elements of said spectral image using local intensity associated with a respective color channel in said image data.

17. The system according to claim 1, further comprising optics configured for focusing said output light beam directly onto said imager, wherein said image processor is configured to provide a color image of said scene based on image data generated by said imager responsively to said direct focus.

18. The system according to claim 1, wherein image data constituted by an image signal of a single output light beam of said temporal sequence comprises an interference pattern characterized by amplitudes, and wherein said image processor is configured to reduce said amplitudes to provide a color image from said single output light beam.

19. The system according to claim 18, further comprising a scanning stage, for shifting a relative position between said scene and the system, wherein said image processor is configured to extract, for each relative position, a portion of said image data in which fringe pattern amplitudes are reduced relative to other portions of said image data, and to tile said extracted portions.

20. The system of claim 19, wherein said tiling comprises removing periodic parts of in said extracted portions.

21. A method of constructing a spectral image of a scene, comprising:
receiving an input light beam from the scene;
converting said input light beam into a temporal sequence of output light beams;
for each output light beam of said sequence, generating an image signal that is spatially resolved into a plurality of color channels; and
collectively processing said image signals to convert image data constituted by said image signals to greyscale levels so as to construct a spectral image of said scene;
wherein said conversion of said image data to greyscale levels comprises binning neighboring picture-elements corresponding to different color channels in a non-overlapping manner.

22. The method according to claim 21, wherein said conversion of said input light beam into a temporal sequence of output light beams is by a controllable interferometer system.

23. The method according to claim 21, wherein said conversion of said input light beam into a temporal sequence of output light beams sequential optical is by a tunable optical filter.

24. The method according to claim 21, further comprising, for each picture-element that correspond to a color channel, applying an intensity correction factor selected to ensure that a ratio between an intensity corresponding to said color channel and an integrated intensity corresponding to a plurality of color channels in a region containing said picture-element is preserved.

25. The method according to claim 21, wherein said generating said image data is by a color imager having a single two-dimensional array of elementary light detectors covered by a color filter array.

26. The method according to claim 21, wherein said generating said image data is by a color imager having a plurality of two-dimensional arrays of elementary light detectors, wherein the system comprises an optical element constructed for splitting said output light beam to said plurality of color channels and to direct different color channels to different arrays.

27. The method according to claim 21, further comprising applying image uniformity correction to spatial information in said spectral image.

28. The method according to claim 21, further comprising correcting an intensity level of each of at least some picture-elements of said spectral image using local intensity associated with a respective color channel in said image data.

29. A method of constructing a color image of a scene, comprising:
receiving by an interferometer system an input light beam from the scene and converting said input light beam into an output light beam constituting two interfering light beams characterized by a fixed optical path difference (OPD) therebetween;
generating from said output beam an image signal that is spatially resolved into a plurality of color channels;
shifting a relative position between said scene and said interferometer system;
extracting, for each relative position, a portion of said image signal in which fringe pattern amplitudes are reduced relative to other portions of said image signal; and
tiling said extracted portions to provide a pixelated color image corresponding to said image signal with reduced fringe pattern amplitudes.

30. The method of claim 29, wherein said tiling comprises removing periodic parts of in said extracted portions.

31. A spectral imaging system, comprising:
a sequential optical system providing a temporal sequence of output light beams describing a scene;
a color imager receiving said output light beams and being configured to responsively generate, for each output light beam, an image signal that is spatially resolved into a plurality of color channels; and
an image processor configured for collectively processing said image signals to convert image data constituted by said image signals to greyscale levels so as to construct a static spectral image of said scene, having a plurality of picture-element and a spectrum for each picture-element;
wherein said conversion of said image data to greyscale levels comprises binning neighboring picture-elements of different color channels and/or integrating intensities over a region of several picture-elements of different color channels;
wherein said image processor is configured to apply for each picture-element that correspond to a color channel, an intensity correction factor selected to ensure that a ratio between an intensity corresponding to said color channel and an integrated intensity corresponding to a plurality of color channels in a region of the image containing said picture-element is preserved.

32. A method of constructing a spectral image of a scene, comprising:
receiving an input light beam from the scene;
converting said input light beam into a temporal sequence of output light beams;
for each output light beam of said sequence, generating an image signal that is spatially resolved into a plurality of color channels;
collectively processing said image signals to convert image data constituted by said image signals to greyscale levels so as to construct a spectral image of said scene; and
applying for each picture-element that correspond to a color channel, an intensity correction factor selected to ensure that a ratio between an intensity corresponding to said color channel and an integrated intensity corresponding to a plurality of color channels in a region of the image containing said picture-element is preserved;
wherein said conversion of said image data to greyscale levels comprises binning neighboring picture-elements of different color channels and/or integrating intensities over a region of several picture-elements of different color channels.

33. A spectral imaging system, comprising:
a sequential optical system providing a temporal sequence of output light beams describing a scene;
a color imager receiving said output light beams and being configured to responsively generate, for each output light beam, an image signal that is spatially resolved into a plurality of color channels; and
an image processor configured for collectively processing said image signals to convert image data constituted by said image signals to greyscale levels so as to construct a static spectral image of said scene, having a plurality of picture-element and a spectrum for each picture-element;
wherein said conversion of said image data to greyscale levels comprises, for each picture-element of at least a few picture-elements in said image data, integrating intensities of picture-elements of different color channels in a region containing said picture-element and assigning to said picture-element a greyscale level based on said integration.

34. A spectral imaging system, comprising:
a sequential optical system providing a temporal sequence of output light beams describing a scene;
an optical element constructed for splitting said output light beams to a plurality of color channels;
a color imager having a plurality of two-dimensional arrays of elementary light detectors each receiving a different color channel, said color imager being configured to responsively generate, for each output light beam, an image signal that is spatially resolved into a plurality of color channels; and
an image processor configured for collectively processing said image signals to convert image data constituted by said image signals to greyscale levels so as to construct a static spectral image of said scene, having a plurality of picture-element and a spectrum for each picture-element;
wherein said conversion of said image data to greyscale levels comprises, for each picture-element of at least a few picture-elements in said image data, integrating intensities over color channels, obtained from respective elementary light detectors of said plurality of two-dimensional arrays and being associated with said picture-element, and assigning to said picture-element a greyscale level based on said integration.

35. A method of constructing a spectral image of a scene, comprising: receiving an input light beam from the scene; converting said input light beam into a temporal sequence of output light beams; by a color imager having a single two-dimensional array of elementary light detectors covered by a color filter array, generating, for each output light beam of said sequence, an image signal that is spatially resolved into a plurality of color channels; and collectively processing said image signals to convert image data constituted by said image signals to greyscale levels so as to construct a spectral image of said scene; wherein said conversion of said image data to greyscale levels comprises binning neighboring picture-elements corresponding to different color channels in a non-overlapping manner.

36. A spectral imaging system, comprising:
a sequential optical system providing a temporal sequence of output light beams describing a scene;
a color imager receiving said output light beams and being configured to responsively generate, for each output light beam, an image signal that is spatially resolved into a plurality of color channels;
a scanning stage, for shifting a relative position between said scene and the system; and
an image processor configured for collectively processing said image signals to convert image data constituted by said image signals to greyscale levels so as to construct a static spectral image of said scene, having a plurality of picture-element and a spectrum for each picture-element;
wherein said conversion of said image data to greyscale levels comprises binning neighboring picture-elements of different color channels and/or integrating intensities of different color channels over a region of several picture-elements;
wherein image data constituted by an image signal of a single output light beam of said temporal sequence comprises an interference pattern characterized by amplitudes, wherein said image processor is configured to reduce said amplitudes to provide a color image from said single output light beam, by extracting, for each relative position, a portion of said image data in which fringe pattern amplitudes are reduced relative to other portions of said image data, and to tile said extracted portions.

37. A method of constructing a spectral image of a scene, comprising:
receiving an input light beam from the scene;
converting said input light beam into a temporal sequence of output light beams;
by a color imager having a single two-dimensional array of elementary light detectors covered by a color filter array, generating, for each output light beam of said sequence, an image signal that is spatially resolved into a plurality of color channels; and
collectively processing said image signals to convert image data constituted by said image signals to greyscale levels so as to construct a spectral image of said scene;
wherein said conversion of said image data to greyscale levels comprises, for each picture-element of at least a few picture-elements in said image data, integrating intensities of picture-elements of different color channels in a region containing said picture-element and assigning to said picture-element a greyscale level based on said integration.

38. A method of constructing a spectral image of a scene, comprising:
  receiving an input light beam from the scene;
  converting said input light beam into a temporal sequence of output light beams;
  using an optical element to split said output light beam to a plurality of color channels and to direct different color channels to different arrays of a color imager having a plurality of two-dimensional arrays of elementary light detectors;
  for each output light beam of said sequence generating by said color imager an image signal that is spatially resolved into a plurality of color channels; and
  collectively processing said image signals to convert image data constituted by said image signals to greyscale levels so as to construct a spectral image of said scene;
  wherein said conversion of said image data to greyscale levels comprises, for each picture-element of at least a few picture-elements in said image data, integrating over color channels, obtained from respective elementary light detectors of said plurality of two-dimensional arrays and being associated with said picture-element, and assigning to said picture-element a greyscale level based on said integration.

* * * * *